United States Patent
Urasaki et al.

(10) Patent No.: US 10,205,072 B2
(45) Date of Patent: Feb. 12, 2019

(54) LIGHT-EMITTING DEVICE AND METHOD OF PREPARING SAME, OPTICAL SEMICONDUCTOR ELEMENT MOUNTING PACKAGE, AND OPTICAL SEMICONDUCTOR DEVICE USING THE SAME

(71) Applicant: HITACHI CHEMICAL COMPANY, LTD., Tokyo (JP)

(72) Inventors: Naoyuki Urasaki, Chikusei (JP); Kanako Yuasa, Saitama (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/603,618

(22) Filed: May 24, 2017

(65) Prior Publication Data

US 2017/0263832 A1 Sep. 14, 2017

Related U.S. Application Data

(62) Division of application No. 12/303,188, filed as application No. PCT/JP2007/060385 on May 21, 2007, now Pat. No. 9,673,362.

(30) Foreign Application Priority Data

Jun. 2, 2006 (JP) ................................ 2006-154652

(51) Int. Cl.
*H01L 33/08* (2010.01)
*H01L 33/60* (2010.01)
(Continued)

(52) U.S. Cl.
CPC .............. *H01L 33/60* (2013.01); *H01L 33/38* (2013.01); *H01L 33/486* (2013.01); *H01L 33/50* (2013.01);
(Continued)

(58) Field of Classification Search
CPC ......... H01L 33/60; H01L 33/50; H01L 33/38; H01L 33/52; H01L 33/486; H01L 33/62;
(Continued)

(56) References Cited

U.S. PATENT DOCUMENTS 5,343,076 A 8/1994 Katayama et al.
6,531,328 B1 3/2003 Chen
(Continued)

FOREIGN PATENT DOCUMENTS

CN 1639224 7/2005
CN 1639224 A 7/2005
(Continued)

OTHER PUBLICATIONS

Office Action of Taiwan Appln. No. 96119083, dated Nov. 14, 2010 with translation.
(Continued)

*Primary Examiner* — (Vikki) Hoa B Trinh
(74) *Attorney, Agent, or Firm* — Fitch, Even, Tabin & Flannery, LLP

(57) ABSTRACT

An optical semiconductor element mounting package that has good adhesion between the resin molding and the lead electrodes and has excellent reliability is provided, as well as an optical semiconductor device using the package is also provided. The optical semiconductor element mounting package having a recessed part that serves as an optical semiconductor element mounting region, wherein the package is formed by integrating: a resin molding composed of a thermosetting light-reflecting resin composition, which forms at least the side faces of the recessed part; and at least a pair of positive and negative lead electrodes disposed opposite each other so as to form part of the bottom face of the recessed part, and there is no gap at a joint face between the resin molding and the lead electrodes.

18 Claims, 2 Drawing Sheets

(51) Int. Cl.
*H01L 33/48* (2010.01)
*H01L 33/38* (2010.01)
*H01L 33/50* (2010.01)
*H01L 33/52* (2010.01)
*H01L 33/62* (2010.01)
*H01L 23/00* (2006.01)

(52) U.S. Cl.
CPC ............. *H01L 33/52* (2013.01); *H01L 24/45* (2013.01); *H01L 24/73* (2013.01); *H01L 33/62* (2013.01); *H01L 2224/32245* (2013.01); *H01L 2224/45144* (2013.01); *H01L 2224/48091* (2013.01); *H01L 2224/48247* (2013.01); *H01L 2224/48465* (2013.01); *H01L 2224/73265* (2013.01); *H01L 2924/181* (2013.01); *H01L 2924/1815* (2013.01)

(58) Field of Classification Search
CPC ..................... H01L 24/73; H01L 24/45; H01L 2224/73265; H01L 2224/32245; H01L 2224/48465; H01L 2224/1815; H01L 2224/48247; H01L 2224/45144; H01L 2224/48091
See application file for complete search history.

(56) References Cited

U.S. PATENT DOCUMENTS

| | | | |
|---|---|---|---|
| 6,670,648 | B2 | 12/2003 | Lsokawa |
| 7,208,772 | B2 | 4/2007 | Lee |
| 7,723,407 | B2 | 5/2010 | Sugioka et al. |
| 7,812,360 | B2 | 10/2010 | Yario |
| 2003/0080341 | A1 | 5/2003 | Sakano et al. |
| 2004/0061810 | A1 | 4/2004 | Lowery et al. |
| 2004/0159850 | A1 | 8/2004 | Takenaka |
| 2004/0211970 | A1* | 10/2004 | Hayashimoto ........ H01L 33/486 257/98 |
| 2005/0222300 | A1 | 10/2005 | Ikezawa et al. |
| 2005/0272896 | A1* | 12/2005 | Kaji .................. C08L 83/06 528/30 |
| 2006/0014873 | A1 | 1/2006 | Ikezawa et al. |
| 2006/0189721 | A1* | 8/2006 | Akiyama ............ C08G 59/621 523/400 |
| 2009/0050925 | A1 | 2/2009 | Kuramoto |
| 2010/0140638 | A1 | 6/2010 | Kotani et al. |
| 2010/0200882 | A1 | 8/2010 | Kotan et al. |
| 2014/0145225 | A1* | 5/2014 | Wu .................... H01L 25/0756 257/98 |

FOREIGN PATENT DOCUMENTS

| | | |
|---|---|---|
| CN | 1639258 A | 7/2005 |
| CN | 1777654 | 5/2006 |
| CN | 101429324 | 5/2009 |
| JP | 60-123047 | 7/1985 |
| JP | 02-129953 | 5/1990 |
| JP | 04-25059 | 1/1992 |
| JP | 08-089789 A | 4/1996 |
| JP | 09-063329 | 3/1997 |
| JP | 2002-223004 | 8/2002 |
| JP | 2002223001 | 8/2002 |
| JP | 2002-280616 A | 9/2002 |
| JP | 2003-327667 A | 11/2003 |
| JP | 2004-055632 A | 2/2004 |
| JP | 2004-266186 | 9/2004 |
| JP | 2004-342782 A | 12/2004 |
| JP | 2004-363537 | 12/2004 |
| JP | 2005-112965 | 4/2005 |
| JP | 2005-136379 A | 5/2005 |
| JP | 2005-146191 A | 6/2005 |
| JP | 2005259972 A * | 9/2005 |
| JP | 2006-086178 | 3/2006 |
| JP | 2006-140207 A | 6/2006 |
| JP | 2006-156704 | 6/2006 |
| JP | 4608294 | 10/2010 |
| KR | 2004-0094743 | 11/2004 |
| KR | 2006-0010768 | 2/2006 |
| TW | 2003 05609 | 11/2003 |
| TW | 200306331 A | 11/2003 |
| TW | 200418210 | 9/2004 |
| TW | 200606208 | 2/2006 |
| TW | 200616265 | 5/2006 |
| TW | 200617093 | 6/2006 |
| WO | 03/072628 A1 | 9/2003 |
| WO | 03/072655 A1 | 9/2003 |
| WO | 2005/090472 | 9/2005 |

OTHER PUBLICATIONS

English translation of the International Preliminary Report of International App. No. PCT/JP2007/060385.
Substantive Examination Adverse Report of Malaysia Appln. PI 20084897 dated Jan. 15, 2010 in English.
Chinese Office Action 2007800205423 dated Jan. 15, 2010 with translation.
Office Action of Korean Appln. No. 10-2008-7030031 dated Aug. 31, 2010 with translation.
Office Action of Taiwan Appln. No. 96119083 dated Sep. 14, 2010 with translation.
Japanese Office Action of Appln. No. 2008-520477 with partial translation.
Chinese Office Action dated Mar. 18, 2011 with English translation.
Japanese Office Action Appln. No. 2008-520477 dated Aug. 30, 2011 with partial English translation.
Korean Office Action of Appln. No. 10-2008-7030031 dated Jun. 30, 2011 with partial English translation.
Chinese office action of Appln. 200780020542.3 dated Sep. 21, 2011 with partial English translation.
Korean Office Action of Appln. No. 10-2011-7023259 dated Apr. 9, 2012 with partial English translation.
Chinese Office Action of Appln. No. 200780020542.3 dated Jul. 2, 2012 with partial English translation.
Office Action of Korean Application No. 10-2011-7023259 dated Feb. 25, 2013 with partial English translation.
JP Office Action of Appln. No. 2011-049654 dated Jun. 4, 2013 with partial English translation.
Chinese office action of Appln. No. 201110261571.7 dated Jun. 24, 2013 with English translation.
Korean office action of Appln. No. 10-2013-7011152 dated Aug. 22, 2013 with English translation.
JP Office Action of Appln. No. 2011-049654 dated Dec. 10, 2013 with partial English translation.
Taiwanese Office Action in counterpart Appln. No. 099144053 dated Feb. 21, 2014 with partial English translation.
CN Office Action of Appln. No. 201110261571.7 dated Sep. 29, 2014 with English translation.
CN Office Action of Appn. No. 201210434292.1 dated Oct. 31, 2014 with English translation.
Korean Notification No. 10-2014-7032269 dated Feb. 6, 2015 with English translation.
Decision to Grant of Korean Patent Appl. No. 10-2010-7029636 dated Apr. 6, 2012 with English translation.
Office Action in counterpart Chinese Appln. No. 201210484292.1 dated Sep. 8, 2015 with English translation.
Appeal Decision of JP Appln. No. 2011-049654 dated Aug. 11, 2015 in counterpart application with English translation.
Office Action in counterpart Chinese Appln. No. 201110261571.7 dated Jan. 8, 2016 with English translation.
Office Action of counterpart CN Appln. 201110261571.7 dated Jul. 21, 2016 with English translation.
Office Action of counterpart TW Appln. 103137201 dated Jul. 23, 2015 with English translation.
Office Action of counterpart TW Appln. 103137201 dated Sep. 21, 2016 with English translation.
Office Action of Chinese Appln. No. 201210484292.1 dated Nov. 4, 2016 with English translation.

(56) References Cited

OTHER PUBLICATIONS

JP Notification of Appln. No. 2011-049654 dated May 11, 2015 with English translation.
Office Action of counterpart CN Appln. 201110261571.7 dated May 15, 2015 with English translation.
Office Action of counterpart TW Appln. 103137201 dated Dec. 3, 2015.
EP Search Report of Appln. No. 07743819.0 dated Apr. 15, 2014 in English.
Office Action of counterpart CN Appln. 201110261571,7 dated Apr. 2, 2014 with English translation.
Korean office action of Appln. No. 10-2010-7029636 dated Apr. 6, 2012 with English translation.
Decision to Grant Korean Patent Appl. No. 10-2010-7029636 dated Apr. 6, 2012 with English translation.
Office Action of Taiwan application No. 106120008 dated Oct. 3, 2017 with English translation.

\* cited by examiner

LIGHT-EMITTING DEVICE AND METHOD OF PREPARING SAME, OPTICAL SEMICONDUCTOR ELEMENT MOUNTING PACKAGE, AND OPTICAL SEMICONDUCTOR DEVICE USING THE SAME

CROSS-REFERENCE TO RELATED APPLICATION

This application is a divisional application of U.S. application Ser. No. 12/303,188, filed Dec. 2, 2008, which is a 371 of international application PCTJP2007/060385 filed May 21, 2007, the entire contents of each of which are incorporated herein by reference.

TECHNICAL FIELD

This invention relates to an optical semiconductor element mounting package that is useful in manufacturing an optical semiconductor device that combines an optical semiconductor element with a wavelength conversion means such as fluorescent material, and to an optical semiconductor device using the package.

BACKGROUND

Optical semiconductor devices (light emitting devices) of the SMD (surface mounted device) type and having the structure shown in FIG. 3 have often been used in recent years in place of a lead type of optical semiconductor device in an effort to reduce the size and thickness of the optical semiconductor device. With a surface mounted type of optical semiconductor device, usually an optical semiconductor element (LED, etc.) 400 is mounted via a die-bonding material 406 on the bottom face of a recessed part of an optical semiconductor element mounting package in which positive and negative lead electrodes 404 are integrated with a resin molding 403 having a recessed part that serves as the region where the optical semiconductor element will be mounted. And then, the optical semiconductor element 400 and the lead electrodes 404 are electrically connected with a bonding wire 401, after which the recessed part is packed with a transparent sealing resin 402 that includes a fluorescent material 405, and the optical semiconductor element 400 is sealed to complete the manufacture of the optical semiconductor device. The above-mentioned optical semiconductor element mounting package is usually manufactured by placing lead electrodes in a mold, injecting a molten thermosetting resin composition into the closed mold, and returning the resin composition to room temperature to cure it and integrate the components. Japanese Laid-Open Patent Applications 2002-280616, 2004-055632, and 2004-342782 disclose an SMD-type LED apparatus that makes use of an optical semiconductor element mounting package in which positive and negative lead electrodes and a resin molding having a recessed part are integrated.

DISCLOSURE OF THE INVENTION

Optical semiconductor devices have come to be used in a wide range of fields, and it has become increasingly common in recent years for them to be used under harsh conditions, which means that these devices need to have higher reliability than what was needed in the past. However, the thermosetting resin compositions that are commonly used to produce the above-mentioned resin moldings have a coefficient of linear expansion (20 to 120 ppm/° C.) that is greater than the coefficient of linear expansion (approximately 17 ppm/° C.) of the copper that is typically used for lead electrodes, so a great deal of stress is generated when these materials are integrated, and this results in a decrease in adhesion between the resin molding and the lead electrodes, producing a gap on the order of a few dozen microns in between. If the adhesion between the resin molding and the lead electrodes decreases, the stress applied. In the course of bending the outer leads of the lead electrodes will also create such a gap, and this lowers the reliability of the optical semiconductor device.

Also, if injection molding is employed in the production of a resin molding by injecting a resin composition into a mold, the injection pressure of the resin may produce a slight deformation of the mold, in which case resin flash (a parting line) is produced on the side faces of the optical semiconductor element mounting package. This resin flash becomes a hindrance in the forming process, and makes it extremely difficult to accurately work outer leads to match the outer faces of the resin molding in order to reduce the size of the optical semiconductor device. Also, stress is applied in the longitudinal direction at the boundary between the resin molding and the lead electrodes here, and a gap is produced at this boundary from the distal end portion of the flash extending in the lateral direction. Furthermore, there is the risk that the resin flash will separate, and if this happens, it can cause cracking in the package, moisture or foreign matter may get in through these cracks, and this greatly diminishes the reliability of the optical semiconductor device. Also, if the flash separation is deep, it can create a void that mars the appearance of the device.

Also, optical semiconductor elements having an emission peak wavelength in the ultraviolet band, for example, have been developed in recent years, and these elements hold much promise in their application to SMD-type LEDs, but because light near the ultraviolet band has such high energy, it tends to degrade the recessed part inner peripheral face (reflector) of the resin molding, and as this degradation of the inner peripheral face progresses, even reflectivity of visible light will decrease.

DISCLOSURE OF THE INVENTION in view of this situation, it is an object of the present invention to provide an optical semiconductor element mounting package that has good adhesion between the resin molding and the lead electrodes and has excellent reliability, as well as an optical semiconductor device using the package.

It is another object of the present invention to provide an optical semiconductor element mounting package that has a recessed part (reflector) with high reflectivity of light ranging from visible light to near-ultraviolet light after curing, and excellent tight resistance and thermal degradation resistance, as well as an optical semiconductor device using the package.

Specifically, the present invention is characterized by the following items (1) to (12).

(1) An optical semiconductor element mounting package having a recessed part that serves as an optical semiconductor element mounting region, wherein the package is formed by integrating: a resin molding composed of a thermosetting light-reflecting resin composition, which forms at least the side faces of the recessed part; and at least a pair of positive and negative lead electrodes disposed opposite each other so as to form part of the bottom face of the recessed part, and there is no gap at a joint face between the resin molding and the lead electrodes.

(2) The optical semiconductor element mounting package according to (1) above, wherein the integration of the resin molding and the positive and negative lead electrodes is performed by transfer molding.

(3) The optical semiconductor element mounting package according to (1) or (2) above, wherein the thermosetting light-reflecting resin composition includes a filler.

The optical semiconductor element mounting package according to (1) or (2) above, wherein the thermosetting light-reflecting resin composition includes components: (A) an epoxy resin; (B) a curing agent; (C) a curing accelerator; (D) an inorganic filler; (B) a white pigment; and (F) a coupling agent, and is a resin composition whose optical reflectivity at a wavelength of 350 to 800 nm is at least 80% and which can be press molded at normal temperature (0 to 35° C.)

(5) The optical semiconductor element mounting package according to (4) above, wherein the inorganic filler (D) is at least one type selected from the group consisting of silica, alumina, magnesium oxide, antimony oxide, aluminum hydroxide, magnesium hydroxide, barium sulfate, magnesium carbonate, and barium carbonate.

(6) The optical semiconductor element mounting package according to (4) or (5) above, wherein the white pigment (5) is inorganic hollow particles.

(7) The optical semiconductor element mounting package according to any of (4) to (6) above, wherein the average particle size of the white pigment (5) is between 0.1 and 50 μm.

(8) The optical semiconductor element mounting package according to any of (4) to (7) above, wherein the total amount of the inorganic filler (D) and the white pigment (5) is from 70 to 85 vol % with respect to the entire thermosetting light-reflecting resin composition.

(9) The optical semiconductor element mounting package according to any of (1) to (8) above, wherein the spiral flow of the thermosetting light-reflecting resin composition is at least 50 cm and no more than 300 cm.

(10) The optical semiconductor element mounting package according to any of (1) to (9) above, wherein the disk flow of the thermosetting light-reflecting resin composition is at least 50 mm.

(11) The optical semiconductor element mounting package according to any of (1) to (10) above, wherein the coefficient of linear expansion of the thermosetting light-reflecting resin composition is 10 to 30 ppm/° C.

(12) An optical semiconductor device, comprising: the optical semiconductor element mounting package according to any of (1) to (11) above; an optical semiconductor element mounted on the bottom face of a recessed part of the package; and a transparent sealing resin layer that covers the optical semiconductor element in the recessed part.

With the present invention, it is possible to provide an optical semiconductor element mounting package that has good adhesion between the resin molding and the lead electrodes and has excellent reliability, as well as an optical semiconductor device using the package, and furthermore it is possible to provide an optical semiconductor element mounting package that has a recessed part with high reflectivity of light ranging from visible light to near-ultraviolet light after curing, and excellent light resistance and thermal degradation resistance, as well as an optical semiconductor device using the package.

In the present invention, saying that "there is no gap" at the joint face between the resin molding and the lead electrodes refers to a state in which no gap is observed at the interface where the resin molding comes into contact with the lead electrodes when this interface is observed at a magnification of 200 times using a SEM, metal microscope, or the like.

Also, this application includes a claim of priority right based on Japanese Patent Application 2006-154652 (application date: Jun. 2, 2006) already filed by the applicant of the present invention, and the Specification thereof is included herein for the sake of reference.

BEST MODE FOR CARRYING OUT THE INVENTION

Figure 3:
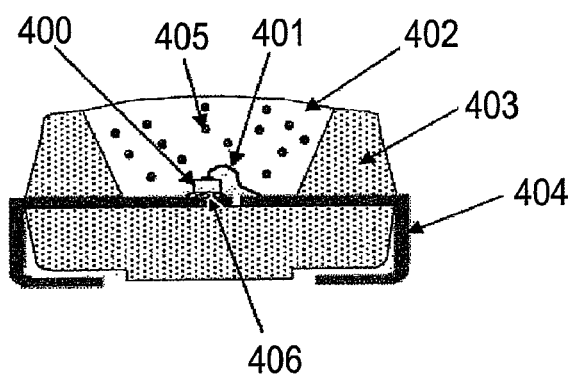
FIG. 3 is a cross section of a typical SMD-type LED (optical semiconductor device).

The optical semiconductor element mounting package of the present invention is an optical semiconductor element mounting package having a recessed part that serves as an optical semiconductor element mounting region, wherein the package is formed by integrating: a resin molding composed of a thermosetting light-reflecting resin composition, which forms at least the side faces of the recessed part; and at least a pair of positive and negative lead electrodes disposed opposite each other so as to form part of the bottom face of the recessed part, and there is no gap at the joint face between the resin molding and the lead electrodes. Preferably, one end of the positive lead electrode and one end of the negative lead electrode are disposed opposite each other so as to form the bottom face of the recessed part, with the surface (main face) of each exposed, and the ends are separated by molding resin in between them. It is also preferable if the other end of the positive lead electrode and the other end of the negative lead electrode are provided so as to protrude from the resin molding side faces immediately after integration with the resin molding, and the protruding outer lead parts thereof are, as shown in FIG. 3, for example, bent toward the inside of the joint face of the package molding, producing J-bend positive and negative connection terminals. Naturally, the structure of the connection terminals in the present invention is not limited to a J-bend type, and may be a gullwing type or another such structure.

The constitution and manufacturing method of the optical semiconductor element mounting package of the present invention, as well as an optical semiconductor device using the package, will now be described in detail.

<Lead Electrodes>

The lead electrodes can be constituted by steel-containing copper or another such material with high thermal conductivity. For example, if can be formed by using a press so as to punch out a metal strip composed of a copper alloy with a thickness of 0.15 mm. The surface of the lead electrodes may be plated with metal such as silver, aluminum, gold, palladium, and an alloy of these, etc., in order to prevent oxidation of the lead electrodes and so forth. Also, the surface of the lead electrodes is preferably made smooth in order to increase optical reflectivity from a light emitting element. Also, the surface area of the lead electrodes is preferably made as large as possible, which enhances heat dissipation, effectively suppresses an increase in the temperature of the light emitting element that is installed, and also allows more power to be sent to the light emitting element, so optical output can be increased.

Figure 4:
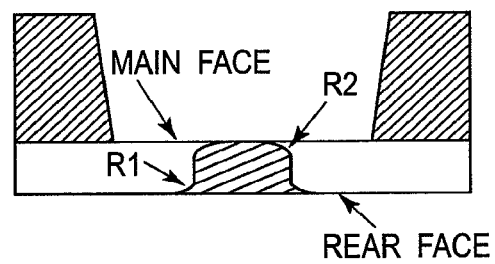
FIG. 4 is a cross section of a favorable structure of the lead electrode ends of the optical semiconductor element mounting package of the present invention.

Also, with the present invention, at least a pair of positive and negative lead electrodes are disposed opposite each other so as to form part of the bottom face of the recessed part of the package, but preferably the corners at which the rear face and side faces intersect is curved at the ends of the opposing lead electrodes (see R1 in FIG. 4; furthermore, the "rear face of the lead electrode" is the back of the face (main face) exposed at the bottom of the recessed part of the package). If the lead electrode ends are thus rounded off in the direction in which the molding resin is injected, the molding resin will more readily fill in between the lead electrodes without leaving any gaps, the lead electrodes can be separated from one another more effectively, and adhesion is increased between the lead electrodes and the resin molding. Furthermore, since the joint line between the resin molding and the lead electrodes is curved, less stress will be concentrated at the joint line, and this reduces the occurrence of package cracking.

Meanwhile, the corners at which the side faces and the main face intersect at the ends of the opposing lead electrodes are preferably built up to an acute angle (see R2 in FIG. 4). This effectively prevents the molding resin from flowing out from between the lead electrodes onto the main face of the lead electrodes, and prevents defective die bonding or wire bonding of the light emitting element. It also increases adhesion between the lead electrodes and the molding resin, and reduces separation at the interface between them.

<Resin Molding>

The resin molding in the package of the present invention is preferably molded from a thermosetting light-reflecting resin composition. The thermosetting light-reflecting resin composition preferably contains a filler. Further, the thermosetting light-reflecting resin composition preferably contains components: (A) an epoxy resin; (B) a curing agent; (C) a curing accelerator; (D) an inorganic filler; (F) a white pigment; and (F) a coupling agent.

The above-mentioned epoxy resin (A) can be any commonly used epoxy resin molding material for sealing electronic components, examples of which include epoxified novolac resins of phenols and aldehydes, such as phenol novolac type epoxy resin or orthocresol novolac type epoxy resin; diglycidyl diethers of bisphenol A, bisphenol F, bisphenol S, and alkyl-substituted biphenol; glycidylamine type epoxy resins obtained by reacting epichlorohydrin and, a polyamine such as isocyanuric acid and diaminodiphenylmethane; and linear aliphatic epoxy resins and alicyclic epoxy resins obtained by oxidizing olefin bonds with peracetic acid. Different kinds of these can also be used together. Of these, one with no coloration is preferable, examples of which include bisphenol A type epoxy resins, bisphenol F type epoxy resins, bisphenol S type epoxy resins, and triglycidyl isocyanurate.

There are no particular restrictions on the above-mentioned curing agent (B) as long as it will react with an epoxy resin, but one with relatively little coloration is preferable. Examples include acid anhydxide-based curing agents and phenol-based curing agents. Examples of acid anhydride-based curing agents include phthalic anhydride, maleic anhydride, trimellitic anhydride, pyromellitic anhydride, hexahydrophthalic anhydride, tetrahydrophthalic anhydride, methyl nadic anhydride, nadic anhydride, glutaric anhydride, methylhexahydrophthalic anhydride, and methyltetrahydrophthalic anhydride. Of these acid anhydride-based curing agents, the use of phthalic anhydride, hexahydrophthalic anhydride, tetrahydrophthalic anhydride, or methylhexahydrophthalic anhydride is preferable. The acid anhydride-based curing agent preferably has a molecular weight of about 140 to 200, and an acid anhydride that is from colorless to pale yellow is preferred. These curing agents may be used singly, or two or more may be used together. It is preferable for the ratio of the epoxy resin and the curing agent to be such that active groups which can react with epoxy groups (acid anhydride groups or hydroxyl groups) in the curing agent account for 0.5 to 1.5 equivalents, and preferably from 0.7 to 1.2 equivalents, per epoxy group equivalent in the epoxy resin. Curing of the epoxy resin composition may be slower and the glass transition temperature of the cured product thus obtained may be lower if the active groups less than 0.5 equivalent, and moisture resistance may decrease if 1.5 equivalents is exceeded.

There are no particular restrictions on the curing accelerator (C) (curing catalyst), but examples include tertiary amines such as 1,8-diaza-bicyclo(5,4,0)undecene-7, triethylenediamine, and tri-2,4,6-dimethylaminomethylphenol; imidazoles such as 2-ethyl-4-methylimidazole and 2-methylimidazole; phosphorus compounds such as triphenylphosphine, tetraphenylphosphonium tetraphenylborate, and tetra-n-butylphosphonium-o,o-diethylphosphorodithioate; quaternary ammonium salts; organic metal salts; and derivatives of these. These can be used alone or together. Of these curing accelerators (curing catalysts), it is preferable to use a tertiary amine, an imidazole, or a phosphorus compound. The amount in which the curing accelerator is contained is preferably from 0.01 to 8.0 parts by weight (hereinafter referred to as "weight parts"), and more preferably from 0.1 to 3.0 weight parts, per 100 weight parts epoxy resin. A sufficient curing acceleration effect may not be obtained if the curing accelerator (curing catalyst) is contained in an amount of less than 0.01 weight, parts, and the cured product may become discolored if the amount is over 8.0 weight parts.

The inorganic filler (D) can be at least one type selected from the group consisting of silica, alumina, magnesium oxide, antimony oxide, aluminum hydroxide, magnesium hydroxide, barium sulfate, magnesium carbonate, and barium carbonate, but a mixture of silica, alumina, antimony oxide, and aluminum hydroxide is preferable from the standpoints of thermal conductivity, optical reflection characteristics, moldability, and fire retardancy. Also, there are no particular restrictions on the average particle size of the inorganic filler, but a range of 0.1 to 100 µm is preferable because packing with the white pigment will be more efficient.

There are no particular restrictions on the white pigment (E), but inorganic hollow particles are preferable, examples of which include sodium silicate glass, aluminum silicate glass, sodium borate glass, alumina, and shirasu (Japanese volcanic ash). The average particle size of the white pigment is preferably between 0.1 and 50 µm if it is less than 0.1 µm, the particles will tend to clump and not disperse as well, but if it is over 50 µm, adequate reaction characteristics will tend not to be obtained.

The total packing amount of the white pigment (E) and the inorganic filler (D) (the filler packing amount) is preferably between 70 and 85 vol % with respect tot the total thermosetting light-reflecting resin composition. The optical reflection characteristics will tend to be inadequate if the filler packing amount is less than 70 vol %, but moldability will suffer and a substrate will tend to be more difficult to produce if the amount is over 85 vol %.

Examples of the coupling agent (F) include silane coupling agents and titanate coupling agents. Commonly used silane coupling agents include those based on epoxysilane, aminosilane, cationic silane, vinylsilane, acryisilane, mercaptosilane, and compounds of these, which are often used in the desired application amount. There are no particular restrictions on the type of coupling agent or the processing conditions, but the amount of coupling agent contained in the thermosetting light-reflecting resin composition is preferably no more than 5 wt %.

In addition, an antioxidant, parting agent, ion sequestering agent, or the like may be added as needed to the thermosetting light-reflecting resin composition.

The thermosetting light-reflecting resin composition containing the above components is preferably press-moldable at room temperature (0 to 35° C.) prior to curing, and preferably has an optical reflectivity of at least 80% at a wavelength of 350 to 800 nm after curing. The above-mentioned press molding can be performed, for example, at room temperature, for about 1 to 5 seconds, at a pressure of 0.5 to 2 MPa. If the above-mentioned optical reflectivity is less than 80%, there will be a tendency for the composition not to contribute sufficiently to increasing the brightness of the optical semiconductor device. More preferably, the optical reflectivity is at least 90%.

The spiral flow of the thermosetting light reflecting resin composition is preferably at least 50 cm and no more than 300 cm, and more preferably at least 50 cm and no more than 200 cm, with at least 50 cm and no more than 150 cm being particularly favorable. If the spiral flow is less than 50 cm, the material will not pack as well, so there will be a tendency for unpacked areas to remain in the product. On the other hand, if the spiral flow is over 300 cm, voids will be more likely to be generated, and bending strength will tend to decrease. The disk flow is preferably at least 50 mm, and more preferably at least 80 mm. If the disk flow is less than 50 mm, there will tend to be unpacked areas or voids between lead frames. The spiral flow here is the value obtained by injecting the resin composition (at an injection pressure of 6.9 MPa) into a metal mold (with a mold temperature of 180° C.) having a spiral groove, and measuring the length of the packed swirl until the resin composition cures. The disk flow is the value obtained by placing 5 g of resin composition between two flat plates of a metal mold (with a mold temperature of 180° C. and a mold weight of 8 kg), and measuring the diameter of the circle over which the resin composition spreads and wets under the weight of the mold.

The coefficient of linear expansion of the thermosetting light-reflecting resin composition is preferably from 10 to 30 ppm/° C. The coefficient of linear expansion here can be found for the thermosetting light-reflecting resin composition either right after it is molded or after it has cured.

Figure 1:
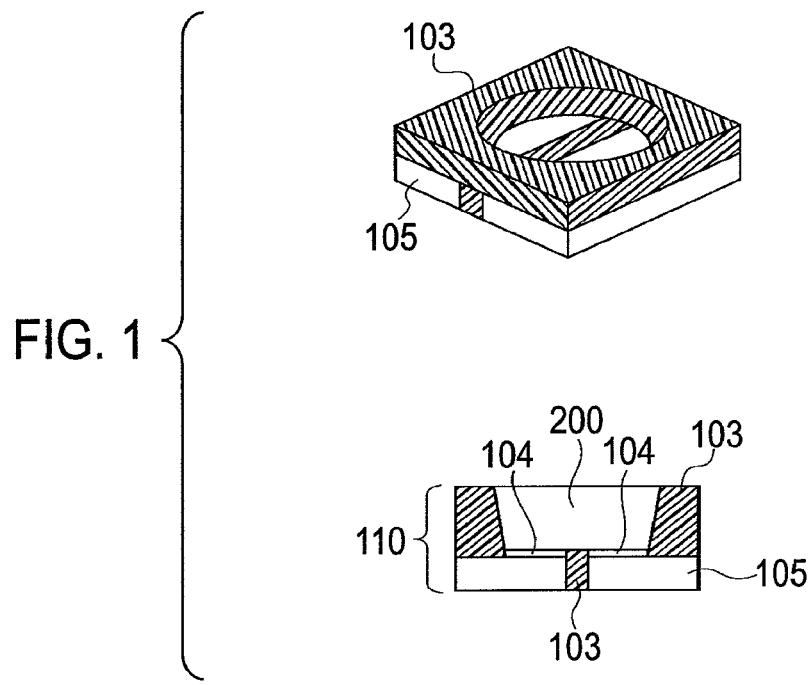
FIG. 1 is an oblique view and a cross section of an embodiment of the optical semiconductor element mounting package of the present invention.

There are no particular restrictions on the shape of the resin molding so long as it has a recessed part that serves as the region for mounting an optical semiconductor element as described above, but it is preferable that the recessed part side wall (reflector) has a shape to allow light to be reflected upward from the optical semiconductor element. FIG. 1 illustrates an embodiment of an optical semiconductor element mounting package 110 of the present invention, comprising a resin molding 103, lead electrodes 105, a recessed part 200 that serves as the region for mounting an optical semiconductor element, and a Ni/Ag plating film 104.

<Method for Manufacturing a Package>

There are no particular restrictions on the method for manufacturing the optical semiconductor element mounting package of the present invention, but preferably the thermosetting light-reflecting resin composition and the lead electrodes are formed integrally by transfer molding. Forming them by transfer molding makes it less likely that there will be a gap between the lead electrodes and the resin molding. More specifically, for example, the lead electrodes are placed in a metal mold of a specific shape, a thermosetting light-reflecting resin composition is injected through a resin injection opening in the mold, and the composition is preferably cured at a mold temperature of 170 to 190° C., a molding pressure of 2 to 8 MPa, and for 60 to 120 seconds. The molding is taken out of the mold, and then heat cured for 1 to 3 hours at an after-curing temperature of 120 to 180° C.

<Optical Semiconductor Device>

The optical semiconductor device of the present invention comprises at least the optical semiconductor element mounting package of the present invention, an optical semiconductor element mounted on the bottom face of a recessed part of this optical semiconductor element mounting package, and a transparent sealing resin layer formed in the recessed part so as to cover an optical semiconductor element.

The above-mentioned optical semiconductor element (light emitting element) is disposed, for example, on a negative lead electrode or a positive lead electrode exposed on the bottom face of the recessed part of the package, the n electrode and the negative lead electrode are connected by wire bonding, and similarly the p electrode and the positive lead electrode are connected by wire bonding. Also, in an element configuration in which the n electrode is formed at the top part of the light emitting element and the p electrode is formed at the bottom part of the light emitting element, the p electrode is bonded by silver paste or another such die bonding material on the positive lead electrode, while the n electrode and the negative lead electrode are connected by wire bonding. Disposing the light emitting element on the lead electrodes in this manner is favorable because heat dissipation from the light emitting element is improved. The light emitting element here is a gallium nitride compound semiconductor element capable of emitting blue light, for example, and said element is configured, for example, such that nitride semiconductor layers including an n-type layer, an active layer, and a p-type layer is formed on a sapphire substrate, parts of the active layer and the p-type layer are removed and an n electrode is formed over the exposed n-type layer, and a p electrode is formed over the p-type layer.

The above-mentioned transparent sealing resin layer protects the light emitting element from external force, moisture, and so forth. With a structure in which the lead electrodes and the electrodes of the light emitting element are connected with wires, this layer also functions to protect these wires. The transparent, sealing resin layer also needs to be highly transmissive to light so that the light from the light emitting element can be efficiently transmitted to the outside. As to the specific material of the transparent sealing resin used in the transparent sealing resin layer, epoxy resins, silicone resins, acrylic resins, and the like are suitable, and a coloring dye or pigment can also be added. In order to subject the light from the light emitting element to a specific filtering effect.

Figure 2:
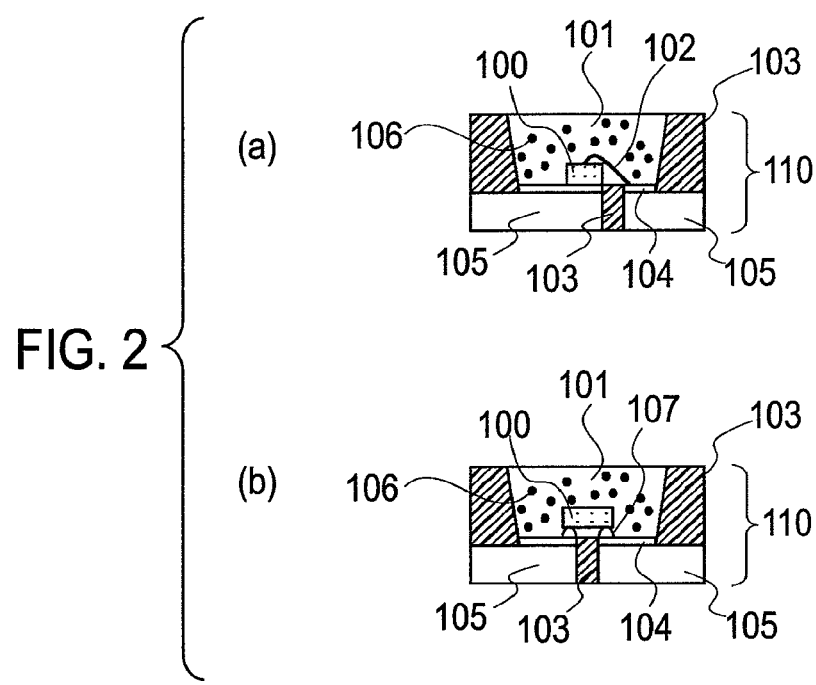
FIG. 2 is a cross section of an embodiment of the optical semiconductor device of the present invention.

FIG. 2 illustrates an embodiment of the optical semiconductor device of the present invention, in which an optical semiconductor element 100 is mounted at a specific location on the bottom of an optical semiconductor element mounting region (recessed part) 200 of the optical semiconductor element mounting package 110 of the present invention, the optical semiconductor element 100 and lead electrodes 105 are electrically connected by a known method such as with a bonding wire 102 or solder bump 107, and the optical semiconductor element 100 is covered by a transparent sealing resin 101 that includes a known fluorescent material 106.

EXAMPLES

The present invention will now be described by giving examples, but the present invention is not limited to or by these examples.

Example 1

(Lead Frame)

A copper frame with a thickness of 0.15 mm was subjected to a standard photoetching process to form a circuit including lead electrodes, after which this circuit was subjected to silver electroplating to produce a lead frame.

TABLE 1

| <Thermosetting Light-Reflecting Resin Composition> | |
|---|---|
| epoxy resin: triglycidyl isocyanurate | 100 weight parts (100 epoxy equivalents) |
| curing agent: hexahydrophthalic anhydride | 140 weight parts |
| curing accelerator: tetra-n-butylphosphonium-o,o-diethylphosphorodithioate | 2.4 weight parts |
| inorganic filler: molten silica (20 μm average particle size) | 600 weight parts |
| alumina (1 μm average particle size) | 890 weight parts |
| white pigment: sodium borate glass balloons (27 μm average particle size) | 185 weight parts |
| coupling agent: γ-glycidoxypropyltrimethoxysilane | 19 weight parts |
| antioxidant: 9,10-dihydro-9-oxa-10-phosphaphenanthrene-10-oxide | 1 weight part |

A material with the above composition was kneaded with a roll for 10 minutes at a kneading temperature of 30 to 40° C. to produce a thermosetting light-reflecting resin composition. The spiral flow of the resulting resin composition was 140 cm (curing time of 90 seconds), and the disk flow was 85 mm (curing time of 90 seconds). The optical reflectivity of the resulting resin composition was over 90%. This optical reflectivity value was obtained as follows. The above-mentioned resin composition was transfer molded at a molding temperature of 180° C., a molding pressure of 6.9 MPa, and a curing time of 90 seconds, after which it was post-cured for 2 hours at 150° C. to produce a test piece with a thickness of 2.0 mm. The reflectivity of this test piece was measures at a wavelength of 350 to 850 nm using a model V-750 integrating sphere type of spectrophotometer (made by JASCO Corporation).

(Formation of Optical Semiconductor Element Mounting Package)

The lead frame obtained above was positioned in and attached to a metal mold, the thermosetting light-reflecting resin composition obtained above was injected into the mold, and transfer molding was performed at a mold temperature of 180° C., for 90 seconds, at 6.9 MPa, which produced a optical semiconductor element mounting package that had a recessed part in the element mounting region and in which the positive and negative lead electrodes were exposed at the bottom face of this recessed part.

(Manufacture of Optical Semiconductor Device)

An LED element was fixed with a die bonding material to the lead electrodes on the bottom face of the recessed part of the optical semiconductor element mounting package obtained above, and the LED element was affixed over a terminal by heating for 1 hour at 150° C. After this, the LED element and the terminal were electrically connected with a gold wire.

Net, a transparent sealing resin with the following composition was applied by potting to the above-mentioned recessed part so as to cover the LED element, then heated and cured for 2 hours at 150° C. to produce an optical semiconductor device (SMD-type LED).

TABLE 2

| <Composition of Transparent Sealing Resin> | |
|---|---|
| hydrogenated bisphenol A type epoxy resin (trade name Denacol EX252, made by Nagase ChemteX) | 90 weight parts |
| alicyclic epoxy resin (trade name CEL-2021P, made by Daicel) | 10 weight parts |
| 4-methylhexahydrophthalic anhydride (trade name HN-5500E, made by Hitachi Chemical) | 90 weight parts |
| 2,6-di-tert-butyl-4-methylphenol BHT | 0.4 weight part |
| 2-ethyl-4-methylimidazole | 0.9 weight part |

Example 2

TABLE 3

| <Thermosetting Light-Reflecting Resin Composition> | |
|---|---|
| epoxy resin: triglycidyl isocyanurate | 100 weight parts (100 epoxy equivalents) |
| curing agent: hexahydrophthalic anhydride | 125 weight parts |
| curing accelerator: tetra-n-butylphosphonium-o,o-diethylphosphorodithioate | 2.4 weight parts |
| inorganic filler: molten silica (20 μm average particle size) | 720 weight parts |
| alumina (1 μm average particle size) | 640 weight parts |
| white pigment: silica balloons (3 μm average particle size) | 435 weight parts |
| coupling agent: γ-glycidoxypropyltrimethoxysilane | 9 weight parts |
| antioxidant: 9,10-dihydro-9-oxa-10-phosphaphenanthrene-10-oxide | 1 weight part |

A material with the above composition was kneaded with a roll for 10 minutes at a kneading temperature of 30 to 40° C. to produce a thermosetting light-reflecting resin composition. The spiral flow of the resulting resin composition was 100 cm (curing time of 90 seconds), and the disk flow was 55 mm (curing time of 90 seconds). The optical reflectivity of the resulting resin composition after curing was over 90% (350 to 850 nm).

The thermosetting light-reflecting resin composition obtained above was used to produce an optical semiconductor element mounting package and an optical semiconductor device in the same manner as in Example 1.

The optical semiconductor devices of the examples manufactured as above had good bonding strength at the interface between the leads and the package, and no gaps were noted at this interface. Each device was allowed to stand for 24 hours at 85° C. and 85% relative humidity (RH), after which the interface between the resin molding and the transparent sealing resin layer or the lead electrodes was checked for separation, but no separation was noted, and it was confirmed that almost no moisture had infiltrated. Therefore, the optical semiconductor devices of the examples can be considered to have excellent reliability, such as reflow resistance and migration resistance.

The invention claimed is:

1. A light-emitting device comprising
a light-emitting element,
a molded part formed from a thermosetting epoxy resin composition which includes an epoxy resin, a white pigment, and an inorganic filler, wherein the total amount of the inorganic filler and the white pigment is from 70 to 85 vol % with respect to the entire thermosetting light-reflecting resin composition,
at least a pair of lead electrodes, and
a sealing member, wherein
the molded part together with the lead electrodes forms a recess with a bottom surface and a side surface,
the light-emitting element is disposed on the bottom surface of the recess, and light from the light-emitting element is emitted from a light-emitting element surface that is opposite to the light-emitting element surface located adjacent to the bottom surface of the recess, and
the sealing member is located in the recess and is surrounded by the side surface of the recess.

2. The light-emitting device according to claim 1, wherein there is no gap at a joint face between the molded part and the lead electrodes.

3. The light-emitting device according to claim 1, wherein the epoxy resin includes triglycidyl isocyanurate.

4. The light-emitting device according to claim 1, wherein the thermosetting epoxy resin composition further includes acid anhydride-based curing agents.

5. The light-emitting device according to claim 3, wherein the thermosetting epoxy resin composition further includes any one of phthalic anhydride, hexahydrophthalic anhydride, tetrahydrophthalic anhydride, and methylhexahydrophthalic anhydride.

6. The light-emitting device according to claim 1, wherein the sealing member includes any one of epoxy resins, silicone resins, and acrylic resins.

7. The light-emitting device according to claim 1, wherein the light-emitting element is a gallium nitride compound semiconductor element capable of emitting blue light.

8. The light-emitting device according to claim 5, wherein the light-emitting element is a gallium nitride compound semiconductor element capable of emitting blue light.

9. The light-emitting device according to claim 1, wherein the light-emitting element is disposed on the lead electrodes.

10. The light-emitting device according to claim 1, wherein the light-emitting element and the lead electrodes are electrically connected by a bonding wire.

11. A method for preparing a light-emitting device comprising,
a first step of molding a thermosetting epoxy resin composition which includes an epoxy resin, a white pigment and an inorganic filler, wherein the total amount of the inorganic filler and the white pigment is from 70 to 85 vol % with respect to the entire thermosetting light-reflecting resin composition, in a mold with at least a pair of lead electrodes arranged in place by a transfer molding technique to prepare a molded part formed from the thermosetting epoxy resin composition, whereby the molded part together with the lead electrodes forms a recess with a bottom surface and a side surface,
a second step of disposing a light-emitting element on the lead electrodes which forms the bottom surface of the recess together with the molded part formed from the thermosetting epoxy resin composition,
a third step of disposing a sealing member over the light-emitting element in the recess.

12. The method for preparing the light-emitting device according to claim 11, wherein there is no gap at a joint face between the molded part and the lead electrodes.

13. The method for preparing the light-emitting device according to claim 11, wherein the epoxy resin includes triglycidyl isocyanurate.

14. The method for preparing the light-emitting device according to claim 11, wherein the thermosetting epoxy resin composition further includes acid anhydride-based curing agents.

15. The method for preparing the light-emitting device according to claim 13, wherein the thermosetting epoxy resin composition further includes any one of phthalic anhydride, hexahydrophthalic anhydride, tetrahydrophthalic anhydride, and methylhexahydrophthalic anhydride.

16. The method for preparing the light-emitting device according to claim 11, wherein the sealing member includes any one of epoxy resins, silicone resins, and acrylic resins.

17. The method for preparing the light-emitting device according to claim 15, wherein the light-emitting element is a gallium nitride compound semiconductor element capable of emitting blue light.

18. The method for preparing the light-emitting device according to claim 11, wherein the first step by the transfer molding technique is conducted at a mold temperature of 170 to 190° C., a molding pressure of 2 to 8 MPa, and for 60 to 120 seconds.

* * * * *